US012681100B2

(12) United States Patent
Yoshida et al.

(10) Patent No.: US 12,681,100 B2
(45) Date of Patent: Jul. 14, 2026

(54) BATTERY SYSTEM AND ESTIMATION METHOD OF FULL CHARGE CAPACITY

(71) Applicant: TOYOTA JIDOSHA KABUSHIKI KAISHA, Toyota (JP)

(72) Inventors: Hiroshi Yoshida, Anjo (JP); Takashi Ogura, Seto (JP); Yuki Sugo, Seto (JP); Koichi Nishino, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 171 days.

(21) Appl. No.: 18/744,709

(22) Filed: Jun. 17, 2024

(65) Prior Publication Data

US 2025/0076398 A1     Mar. 6, 2025

(30) Foreign Application Priority Data

Sep. 5, 2023     (JP) ................................. 2023-143507

(51) Int. Cl.
| | |
|---|---|
| *G01R 31/388* | (2019.01) |
| *G01R 31/36* | (2020.01) |
| *G01R 31/374* | (2019.01) |
| *H01M 10/44* | (2006.01) |

(52) U.S. Cl.
CPC ....... *G01R 31/388* (2019.01); *G01R 31/3648* (2013.01); *G01R 31/374* (2019.01); *H01M 10/44* (2013.01)

(58) Field of Classification Search
CPC .............. G01R 31/388; G01R 31/3648; G01R 31/374; G01R 31/3842; H01M 10/44; H01M 10/48
See application file for complete search history.

(56) References Cited

U.S. PATENT DOCUMENTS

| | | | |
|---|---|---|---|
| 2012/0176092 A1* | 7/2012 | Fujii .................. | G01R 31/3828 |
| | | | 324/427 |
| 2014/0125345 A1 | 5/2014 | Sejima et al. | |
| 2016/0049821 A1* | 2/2016 | Aridome .............. | H01M 10/44 |
| | | | 320/128 |
| 2016/0318417 A1* | 11/2016 | Suzuki ................... | B60L 53/14 |

FOREIGN PATENT DOCUMENTS

| | | |
|---|---|---|
| JP | 2011-209086 A | 10/2011 |
| JP | 2012-145403 A | 8/2012 |
| JP | 2014-167457 A | 9/2014 |

* cited by examiner

*Primary Examiner* — Daniel R Miller
(74) *Attorney, Agent, or Firm* — SoraIP, Inc.

(57) ABSTRACT

The threshold cumulative value calculation unit calculates a threshold cumulative value. The current cumulating unit cumulates the charging current. When the first current cumulative value, which is the cumulative value from the start of charging, becomes equal to or larger than the threshold cumulative value, the maximum value detecting unit starts detection of the local maximum value of the amount of change in the voltage. The full charge capacity calculation unit calculates a full charge capacity by adding a first current cumulative value, which is a current cumulative value from when the maximum value is detected to when the full charge is detected, to a reference capacity when the maximum value is detected.

4 Claims, 5 Drawing Sheets

CHARGE CURRENT
CUMULATION PROCESS

START

S20

F=1?

YES

NO

S21

ΣQ1 CALCULATION

S22

ΣQ2 CALCULATION

S23

FULL CHARGE?

NO

YES

END

OFFSET
LEARNING PROCESS

START

S30

DETECT ΔVB MAXIMA
ON ALL CELLS?

NO

S31

OFFSET LEARNING
DISABLED

YES

S32

ALLOW
OFFSET LEARNING

END

FIG. 6

BATTERY SYSTEM AND ESTIMATION METHOD OF FULL CHARGE CAPACITY

CROSS-REFERENCE TO RELATED APPLICATION

This application claims priority to Japanese Patent Application No. 2023-143507 filed on Sep. 5, 2023, incorporated herein by reference in its entirety.

BACKGROUND

1. Technical Field

The present disclosure relates to a battery system and an estimation method of estimating a full charge capacity.

2. Description of Related Art

Japanese Unexamined Patent Application Publication No. 2014-167457 (JP 2014-167457 A) describes detecting a singularity, which is a maximum value of voltage change amount of a secondary battery during charging and discharging, and estimating capacity of the secondary battery based on the singularity.

SUMMARY

In JP 2014-167457 A, when a plurality of singularities exists in the secondary battery, a singularity on a side at which voltage is high is selected, and the capacity of the secondary battery is estimated. Specifically, detection of singularities from the time of starting charging is executed, determination is made regarding whether a detected singularity is a singularity appearing first, or is a singularity appearing next, based on voltage at the time of starting charging, state of charge (SOC), and so forth, the singularity that is on the side at which voltage is identified, and the capacity of the secondary battery is estimated. However, at the time of start of charging, there are cases in which a singularity (a maximum value of the voltage change amount) may not be accurately detected due to effects of polarization or the like. Thus, there is a concern that the capacity cannot be accurately estimated.

An object of the present disclosure is to accurately estimate capacity (full charge capacity) of a battery.

A battery system according to the present disclosure includes a battery, a voltage sensor for detecting a voltage of the battery, a current sensor for detecting a charging current of the battery, and a control device, in which the control device includes a current cumulating unit for computing a charging current cumulative value that is a cumulative value of the charging current of the battery, and a maximum value detecting unit for detecting a maximum value of a voltage change amount when charging the battery, based on the voltage of the battery, detects the maximum value after a first current cumulative value that is the charging current cumulative value from a start of charging of the battery becomes equal to or greater than a predetermined value, and estimates a full charge capacity of the battery, based on a second current cumulative value that is the charging current cumulative value from when the maximum value is detected until the battery is fully charged.

According to this configuration, the control device of the battery system computes the first current cumulative value that is the charging current cumulative value from the start of the charging of the battery, in the current cumulating unit. The control device detects the maximum value of the voltage change amount after the first current cumulative value becomes equal to or greater than the predetermined value, in the maximum value detecting unit. The current cumulating unit computes a second current cumulative value that is the charging current cumulative value from when the maximum value is detected until the battery is fully charged. The control device estimates the full charge capacity of the battery based on the second current cumulative value.

The maximum value of the voltage change amount at the time of charging is detected after the first current cumulative value becomes equal to or greater than the predetermined value. The detection of the maximum value of the voltage change amount is not executed until the first current cumulative value becomes equal to or greater than the predetermined value. Accordingly, the maximum value on the side of the battery at which voltage is high can be detected without being affected by polarization or the like at the time of start of charging, and the full charge capacity of the battery can be accurately estimated.

Preferably, the predetermined value may be set based on a time from an end time of charging or discharging of the battery a previous time to the start of charging this time, the voltage at a time of starting charging, and a temperature of the battery at the time of starting charging.

According to this configuration, the state of polarization is comprehended by the time from the end of the charging or discharging of the battery the previous time to the start of charging this time, and the state of a remaining capacity (or SOC) of the battery can be comprehended by the voltage at the start time of charging and the temperature of the battery at the time of starting charging. By setting the predetermined value using these parameters, it can be satisfactorily ensured that a maximum value on a side of the battery at which voltage is low is exhibited from the start of charging until the first current cumulative value becomes equal to or greater than the predetermined value. Thus, the maximum value on the high voltage side can be satisfactorily detected.

Preferably, the full charge capacity may be calculated by adding the second current cumulative value to a reference capacity that is set in advance.

The maximum value on the high voltage side appears when the remaining capacity of the battery is approximately the same value, regardless of the deterioration state of the battery or the like. Remaining capacity when the maximum value on the high-voltage side appears is set as the reference capacity. Thus, the full charge capacity can be estimated by adding the second current cumulative value to the reference capacity.

Preferably, the control device may further include an offset learning unit that stops charging when charging the battery, and calculates an offset value of the current sensor, and perform calculation of the offset value by the offset learning unit, on condition that the maximum value is detected.

According to this configuration, the offset learning unit calculates the offset value on condition that the maximum value is detected. Since the charging is not stopped by offset learning until the maximum value is detected, the maximum value can be satisfactorily detected.

An estimation method of estimating a full charge capacity of a battery according to the present disclosure includes determining whether a first current cumulative value that is a cumulative value of a charging current from a start of charging of the battery is equal to or greater than a predetermined value, detecting a maximum value of a voltage change amount of the battery when the first current cumulative value is equal to or greater than the predetermined value, calculating a second current cumulative value by cumulation of the charging current from when the maximum value is detected until the battery is fully charged, and estimating the full charge capacity of the battery by adding the second current cumulative value to a reference capacity that is set in advance.

According to this method, when the first current cumulative value is equal to or greater than the predetermined value, the maximum value of the voltage change amount of the battery is detected, the charging current from the time of detecting the maximum value until the battery is fully charged is cumulated, and the second current cumulative value is calculated. The second current cumulative value is then added to the reference capacity that is set in advance to estimate the full charge capacity of the battery. The detection of the maximum value of the voltage change amount is not executed until the first current cumulative value becomes equal to or greater than the predetermined value. Accordingly, the maximum value on the side of the battery at which voltage is high can be detected without being affected by polarization or the like at the time of start of charging, and the full charge capacity of the battery can be accurately estimated.

According to the present disclosure, capacity (full charge capacity) of a battery can be accurately estimated.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 6 is a diagram illustrating an exemplary functional block configured as a ECU in the present embodiment.

DETAILED DESCRIPTION OF EMBODIMENTS

Figure 1:
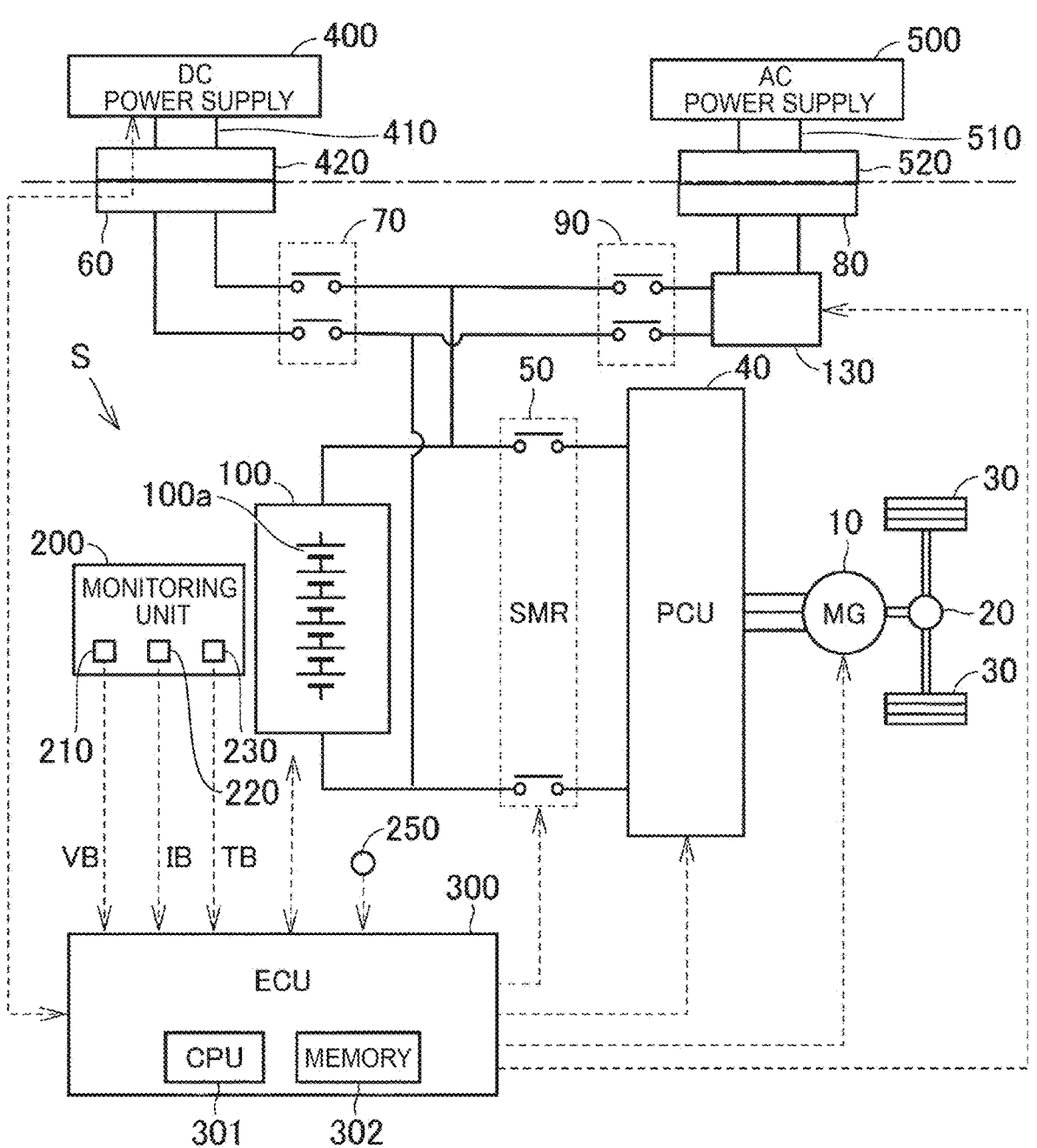
FIG. 1 is an entire configuration diagram of a electrified vehicle in which a battery system according to the present embodiment is mounted.

Hereinafter, embodiments of the present disclosure will be described in detail with reference to the drawings. In the drawings, the same or corresponding parts are denoted by the same reference numerals, and the description thereof will not be repeated.

FIG. 1 is an entire configuration diagram of a electrified vehicle 1 in which a battery system S according to the present embodiment is mounted. In the present embodiment, electrified vehicle 1 is, for example, a battery electric vehicle. The electrified vehicle 1 includes a motor generator (a MG) 10, a power transmission gear 20, a drive wheel 30, a power control unit (PCU) 40, a system main relay (SMR) 50, a battery 100, a monitoring unit 200), and an electronic control unit (ECU) 300 that is an exemplary control device.

MG 10 is, for example, an embedded-structure permanent-magnet synchronous motor (IPM motor), and has a function as an electric motor and a function as a generator. The output-torque of MG 10 is transmitted to the drive wheels 30 via the power transmission gears 20 including a speed reducer, a differential, and the like.

When electrified vehicle 1 is braked, MG 10 is driven by the drive wheels 30, and MG 10 operates as a generator. As a result, MG 10 also functions as a braking device that performs regenerative braking for converting kinetic energy of electrified vehicle 1 into electric power. Regenerated electric power generated by regenerative braking force in the MG 10 is stored in the battery 100.

The PCU 40 is a power conversion device that bidirectionally converts electric power between the MG 10 and the battery 100. The PCU 40 includes an inverter and a converter that operate, for example, based on a control signal from the ECU 300.

When the battery 100 is discharged, the converter steps up voltage supplied from the battery 100 and supplies the stepped-up voltage to the inverter. The inverter converts DC power which is supplied from the converter into AC power and drives the MG 10.

On the other hand, when the battery 100 is charged, the inverter converts AC power generated by MG 10 into DC power and supplies the DC power to the converter. The converter steps down voltage supplied from the inverter to voltage suitable for charging the battery 100 and supplies the stepped-down voltage to the battery 100.

The SMR 50 is electrically connected to power lines connecting the battery 100 and the PCU 40. If SMR 50 is ON (i.e., conductive) in response to a control signal from ECU 300, power may be transferred between the battery 100 and PCU 40. On the other hand, when SMR 50 is OFF (i.e., disconnected) in response to a control signal from ECU 300, the battery 100 is disconnected from PCU 40.

The battery 100 stores electric power for driving MG 10. The battery 100 is a rechargeable DC power supply (secondary battery), and is configured by stacking a plurality of unit cells (battery cells) 100a and electrically connecting them in series, for example. The battery 100 and the unit cell 100a correspond to the "cell" of the present disclosure. The unit cell 100a may comprise, for example, a lithium-ion cell. In the present embodiment, an iron phosphate lithium-ion battery (LFP cell) in which lithium iron phosphate is used as a positive electrode active material is employed as the unit cell 100a.

The monitoring unit 200 includes a voltage sensor 210, a current sensor 220, and a temperature sensor 230. The voltage sensor 210 detects a voltage VB (a voltage VB between terminals of the unit cell 100a) of the unit cell 100a. The current sensor 220 detects a current IB input to and output from the battery 100 (unit cell 100a). The temperature sensor 230 detects a temperature TB of each of the unit cell 100a. The detecting units output the results of this detection to the ECU 300.

Electrified vehicle 1 includes a DC inlet 60, and the battery 100 can be rapidly charged from an external direct current (DC) power supply that is a charging facility. DC inlet 60 is configured to be connectable to a connector 420 provided at a distal end of the charging cable 410 of the external DC power supply (charging facility) 400. The charge relay 70 is electrically connected to a power line connecting DC inlet 60 and the battery 100. The charge relay 70 switches between supplying and shutting off power between DC inlet 60 and the battery 100 in response to a control signal from ECU 300. When the charge relay 70 is closed, external charging (quick charging) of the battery 100 is performed.

Electrified vehicle 1 includes a AC inlet 80, and the battery 100 can be normally charged from an external alternating current (AC) power supply, which is a charging facility. AC inlet 80 is configured to be connectable to a connector 520 provided at a distal end of the charging cable 510 of the external AC power supply (charging facility) 500. An in-vehicle charger 130 is provided in a power line between AC inlet 80 and the battery 100, and converts AC power supplied from an external AC power supply into DC power and converts the battery 100 into a chargeable voltage. The charge relay 90 is electrically connected to a power line connecting the in-vehicle charger 130 and the battery 100. The charge relay 90 switches between supplying and shutting off the electric power between the in-vehicle charger 130 and the battery 100 in response to a control signal from ECU 300. When the charge relay 90 is closed, external charging (normal) of the battery 100 is performed.

The ECU 300 includes a Central Processing Unit (CPU) 301, memories (e.g., Read Only Memory (ROM) and Random Access Memory (RAM)) 302, etc. ECU 300 controls the devices so that electrified vehicle 1 is in a desired condition based on the signals received from the monitoring unit 200, the signals (e.g., throttle valve opening degree signals, vehicle speed signals, and the like) from the various sensors (not shown), the maps and programs stored in the memory 302, and the like. Further, ECU 300 executes a full-charge-capacity estimation process and an offset-learning process, which will be described later. The battery system S includes a battery 100 (unit cell 100a), a monitoring unit 200, a ECU 300, and the like.

Figure 2:
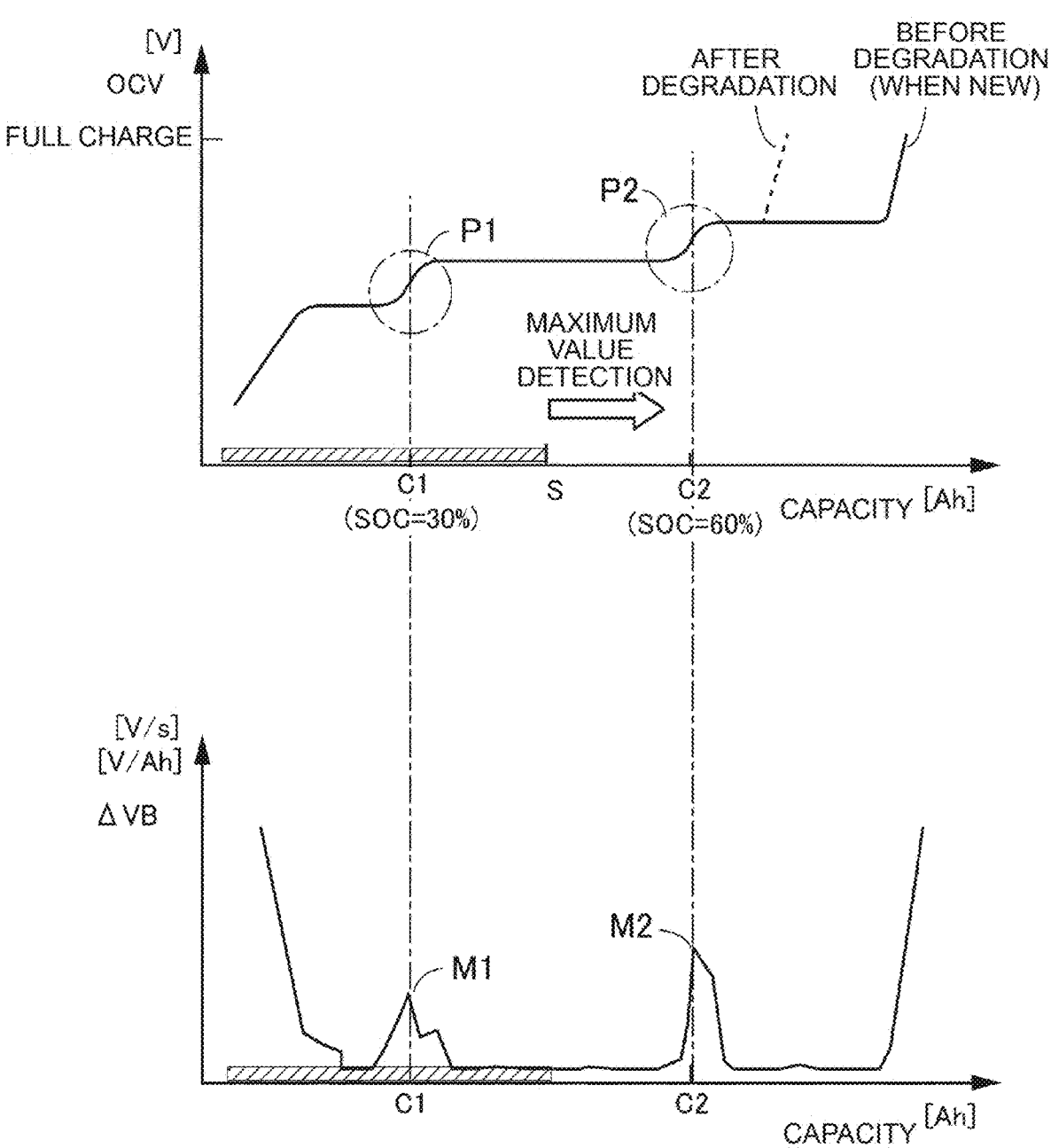
FIG. 2 is a diagram showing the relation between OCV and residual capacitance in the unit cell (LFP cell) of the present embodiment.

FIG. 2 is a diagram showing the relation between Open Circuit Voltage (OCV) and the remaining capacitance in the unit cell 100a (LFP cell) of the present embodiment. In the upper part of FIG. 2, the vertical axis represents OCV [V] of the unit cell 100a, and the horizontal axis represents the remaining capacity (charge capacity) [Ah] of the unit cell 100a. In the relationship between OCV and the remaining capacitance (hereinafter, this relationship is also referred to as a OCV curve), a region (voltage-flat region) in which the change of OCV curve is minute is widely present. When a portion where OCV curve is increased from the voltage flat region and becomes the voltage flat region again is referred to as a "step", in the unit cell 100a of the present embodiment, there are two step P1, P2.

In the step P1 of the first stage (OCV is at the low pressure side), SOC of the unit cell 100a at the time of the new product exists in the vicinity of about 30%. In the step P2 of the second stage (OCV is on the high-voltage side), SOC of the unit cell 100a at the time of a new product exists in the vicinity of about 60%. As shown by a broken line in the upper part of FIG. 2, these steps do not change the position of the steps even when the full charge capacity of the unit cell 100a decreases due to degradation of the unit cell 100a (when the capacity retention rate of the unit cell 100a decreases). Even if the unit cell 100a deteriorates, the residual capacitance at which the step appears does not change.

The lower part of FIG. 2 shows the relationship between the voltage variation ΔVB of the voltage VB and the remaining capacity when the battery 100 is charged, and shows the relationship when the battery is charged with a constant current. The voltage change amount ΔVB is a change amount [V/Ah] of the voltage VB with respect to the remaining capacity (charge capacity) or a change amount [V/s] of the voltage VB with respect to the time (charge time). The voltage change amount ΔVB becomes the maximum value M1 in the remaining capacity corresponding to the step P1, and becomes the maximum value M2 in the remaining capacity corresponding to the step P2. Therefore, the remaining capacity in which the voltage change amount ΔVB becomes the maximum value M1 is stored as the reference capacity C1, and the charging current from when the voltage change amount ΔVB becomes the maximum value M1 until when the full charge is reached is cumulated, and the cumulative value and the reference capacity C1 are added, whereby the full charge capacity of the battery 100 (unit cell 100a) can be estimated. Further, the remaining capacity at which the voltage change amount ΔVB becomes the maximum value M2 is stored as the reference capacity C2, and the charge current from when the voltage change amount ΔVB becomes the maximum value M2 until when the full charge is reached is cumulated, and the cumulative value and the reference capacity C2 are added, whereby the full charge capacity of the battery 100 (unit cell 100a) can be estimated.

The cumulative value of the charging current is cumulated with the detection error or the like of the current sensor 220 as the cumulation time becomes longer (as the cumulation amount becomes larger), so that the accuracy thereof deteriorates. In the present embodiment, in order to improve the estimation accuracy of the full charge capacity, the maximum value M2 corresponding to the step P2 of the second stage (OCV is the high voltage side) is detected, and the charge current from when the maximum value M2 is reached until the full charge is reached is cumulated to estimate the full charge capacity.

Figure 3:
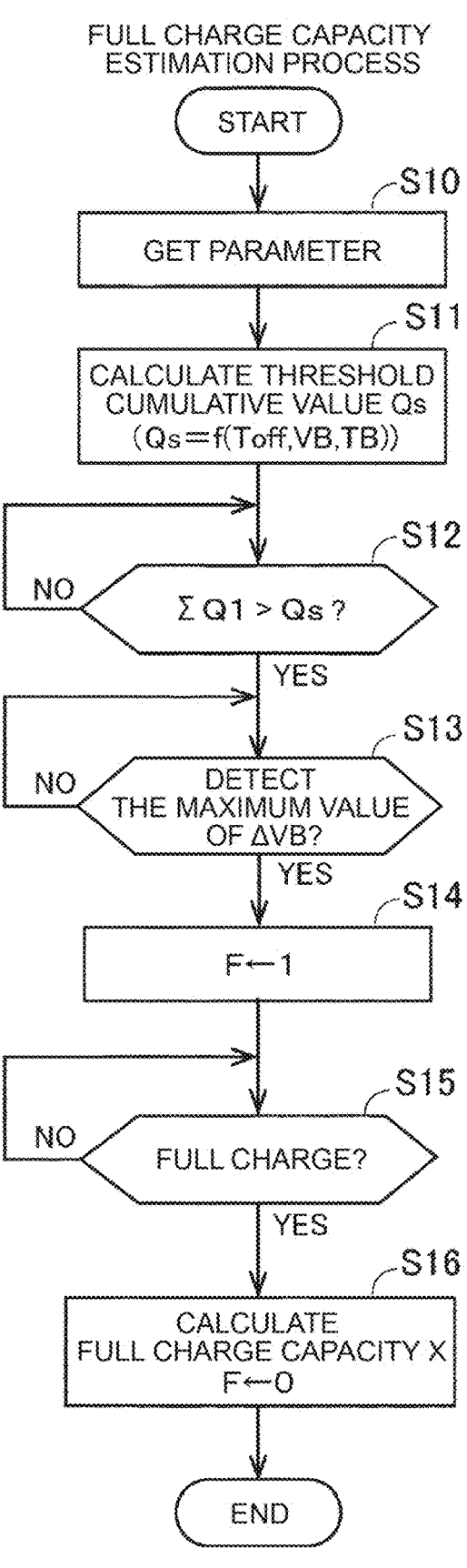
FIG. 3 is a flow chart illustrating an exemplary full-charge-capacity estimation process performed in ECU.

FIG. 3 is a flow chart illustrating an exemplary full-charge-capacity estimation process performed by ECU 300. This flow chart is executed when external charging of the battery 100 is started, and is executed for each unit cell 100a. When the connector 420 is connected to DC inlet 60 or the connector 520 is connected to AC inlet 80 and the external charging of the battery 100 is started, ECU 300 acquires various parameters in step (hereinafter, step is abbreviated as "S") 10. In the present embodiment, ECU 300 acquires IGOFF times Toff, the voltages VB, and the temperature TB. IGOFF time is a time from the last charge/discharge end until the current charge (external charge) is started. For example, the time from when IG switch (power switch) 250 is turned off to the starting time of charging may be counted by a timer (not shown), and IGOFF time may be acquired. The voltage VB is the voltage of the unit cells 100a detected by the voltage sensor 210. The temperature TB is the temperature of the unit cell 100a detected by the temperature sensor 230.

In the following S11, a threshold-cumulative value Qs is calculated. The threshold-cumulative value Qs is calculated using, for example, a three-dimensional map (not shown) having IGOFF times, voltage VB, and temperature TB as parameters. In the present embodiments, as the temperature TB, the lowest temperature TBmin which is the lowest value among the temperature TB of each unit cell 100a is adopted, and the threshold cumulative value Qs is calculated from a three-dimensional map in which IGOFF time, the voltage VB, and the lowest temperature TBmin are used as parameters. The threshold-cumulative value Qs corresponds to a "predetermined value" of the present disclosure.

Figure 4:
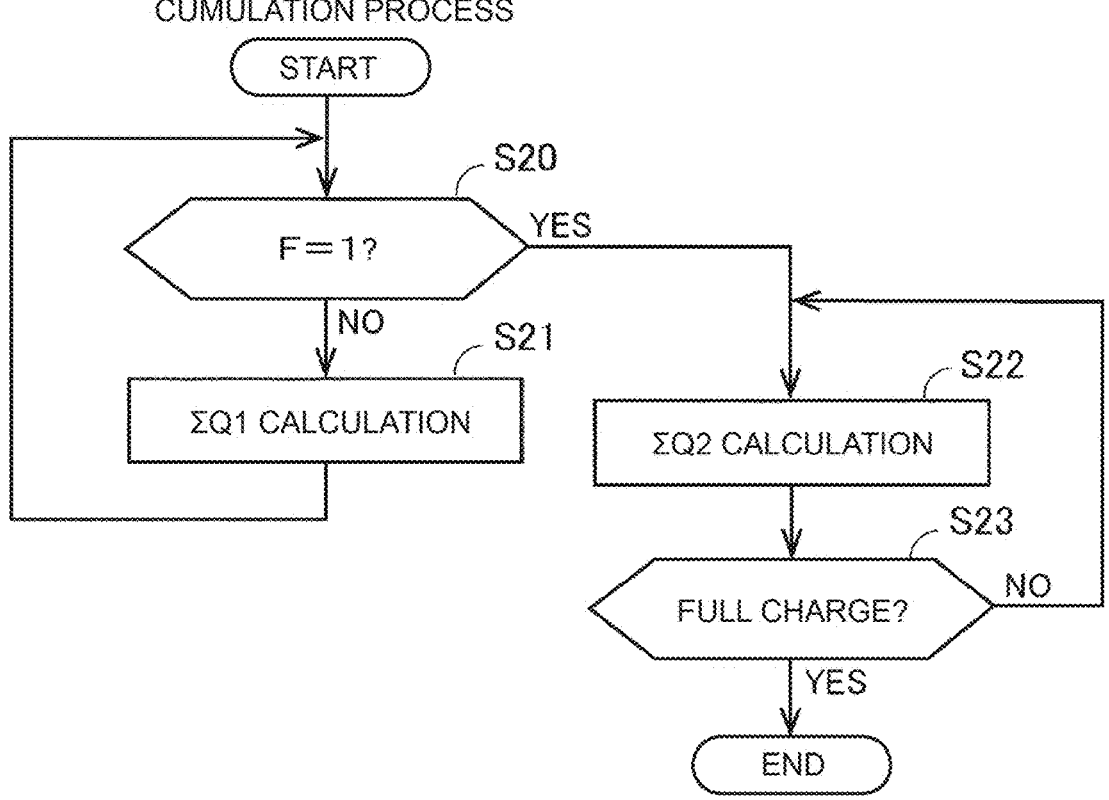
FIG. 4 is a flow chart illustrating an exemplary charge current cumulation process performed by ECU.

In S12, it is determined whether or not the first current cumulative value $\Sigma Q1$ exceeds the threshold-cumulative value Qs. The first current cumulative value $\Sigma Q1$ is a cumulative value of the charging current from the beginning of the external charging of the battery 100 (unit cell 100$a$) to the present. FIG. 4 is a flow chart illustrating an exemplary charge current cumulation process performed by ECU 300. This flowchart is executed when external charging of the battery 100 is started. First, in S20, it is determined whether or not the flag F is 1. The flag F is a flag set to 1 in a S14 (FIG. 3) to be described later, and is set to 0 at the time of starting the external charge and in a S16 (FIG. 3) to be described later. When the external charging starts, since the flag F is 0, the process proceeds to S21 to cumulate the charging current, and the first current cumulative value $\Sigma Q1$ is calculated. The charging current may be an input current to the battery 100 detected by the current sensor 220. The first current cumulative value $\Sigma Q1$ is calculated until the flag F is set to 1.

Returning to FIG. 3, in S12, when the first current cumulative value $\Sigma Q1$ is equal to or smaller than the threshold cumulative value Qs, S12 process is repeated until the first current cumulative value $\Sigma Q1$ exceeds the threshold cumulative value Qs. When the first current cumulative value $\Sigma Q1$ becomes larger than the threshold cumulative value Qs, the process proceeds to S13 to detect the maximum value of the voltage variation $\Delta VB$.

The threshold cumulative value Qs is set in advance by experimentation or the like, when the first current cumulative value $\Sigma Q1$ cumulated from the beginning of the external charge becomes equal to or larger than the threshold cumulative value Qs, the remaining capacity of the unit cell 100$a$ is higher than the remaining capacity in the step P1 (maximum value M1). For example, the threshold cumulative value Qs is set to a larger value as IGOFF period is shorter, is set to a larger value as the voltage VB is lower, and is set to a larger value as the minimum temperature TBmin is lower. As a result, the larger the degree of polarization at the start of charging, the lower SOC at the start of charging (the lower the remaining capacity), the larger the threshold-cumulative value Qs is set. For example, as illustrated in the upper part of FIG. 2, the threshold-cumulative value Qs is set such that if the remaining capacity of the unit cell 100$a$ exceeds S, which is a value larger than the remaining capacity in the step P1 (maximum value M1), an affirmative determination is made on S12. In other words, the detection of the maximum value of the voltage change amount $\Delta VB$ is masked in the hatched region of FIG. 2 (the detection of the maximum value is not performed).

In S13, the maximum value of the voltage-change amount $\Delta VB$ is detected. The voltage change amount $\Delta VB$ may be a change amount [V/Ah] of the voltage VB with respect to the remaining capacity (charge capacity), and may be a change amount [V/s] of the voltage VB with respect to the time (charge time). The maximum value may be detected when the current voltage change amount $\Delta VB$ becomes a small value with respect to the previous voltage change amount $\Delta VB$, and the maximum value M2 is detected. Alternatively, the maximum value may be detected when the sign of the differential value of the voltage change amount $\Delta VB$ changes from positive to negative. In S13, when the maximum value of the voltage-change amount $\Delta VB$ is detected, the process proceeds to S14. The maximum value detected in S13 is the maximum value M2 (see the lower part of FIG. 2).

In S14, after the flag F is set to 1, the process proceeds to S15. In S15, it is determined whether or not the battery 100 is fully charged. For example, if the battery 100 is performing Constant Current-Constant Voltage (CCCV) charging, it may be determined that the battery is fully charged when the charging current falls below a set value. Alternatively, it may be determined that the battery 100 is fully charged when the voltage VB of any of the unit cell 100$a$ reaches the charge termination voltage. When the battery 100 is fully charged, the process proceeds to S16 to calculate the full charge capacity X of the unit cell 100$a$ and set the flag F to 0. When the battery 100 is fully charged, the external charging is stopped (terminated).

Referring to FIG. 4, when the flag F is set to 1, the process proceeds to S22, where the charge current is cumulated, and the second current cumulative value $\Sigma Q2$ is calculated. In the following S23, it is determined whether or not the battery 100 is fully charged, and when the battery is fully charged, the present routine is ended, and when the battery is not fully charged, the calculation of the second current cumulative value $\Sigma Q2$ is continued. The second current cumulative value $\Sigma Q2$ is a cumulative value of the charging current from when the maximum value is detected in S13 (see FIG. 3) (when the flag F is set to 1) to when the maximum value is fully charged.

Returning to FIG. 3, in S16, the full charge capacity X of the unit cell 100$a$ is executed by adding the second current cumulated amount $\Sigma Q2$ to the reference capacity C2 ($X=C2+\Sigma Q2$). As illustrated in FIG. 2, the reference capacity C2 is the remaining capacity (charge capacity) of the unit cell 100$a$ at the maximum value M (step P2), and is set in advance by an experiment or the like.

The first current cumulative value $\Sigma Q1$ and the second current cumulative value $\Sigma Q2$ are calculated by cumulating the detected values of the current sensor 220. When the detection error of the current sensor 220 is large, the calculation accuracy of the first current cumulative value $\Sigma Q1$ and the second current cumulative value $\Sigma Q2$ deteriorates. In particular, in the normal charging using AC power supply, the charging current is smaller than that of the rapid charging, and the effect of the detection error of the current sensor 220 is large. Therefore, it is desirable to perform offset learning to correct the offset error of the current sensor 220 (0 (zero) point correction of the current sensor 220).

When the offset learning of the current sensor 220 is performed, the charging and discharging of the battery 100 is stopped, and a state in which the charging and discharging current does not flow is set. In S13 (see FIG. 3), when the charge is stopped in order to perform the offset-learning while the maximum value of the voltage variation $\Delta VB$ is detected, the voltage VB fluctuates, and there is a fear that the maximum value is erroneously detected or the maximum value cannot be detected. In the present embodiment, the offset learning is executed on condition that the maximum value of the voltage change amount $\Delta VB$ is detected.

Figure 5:
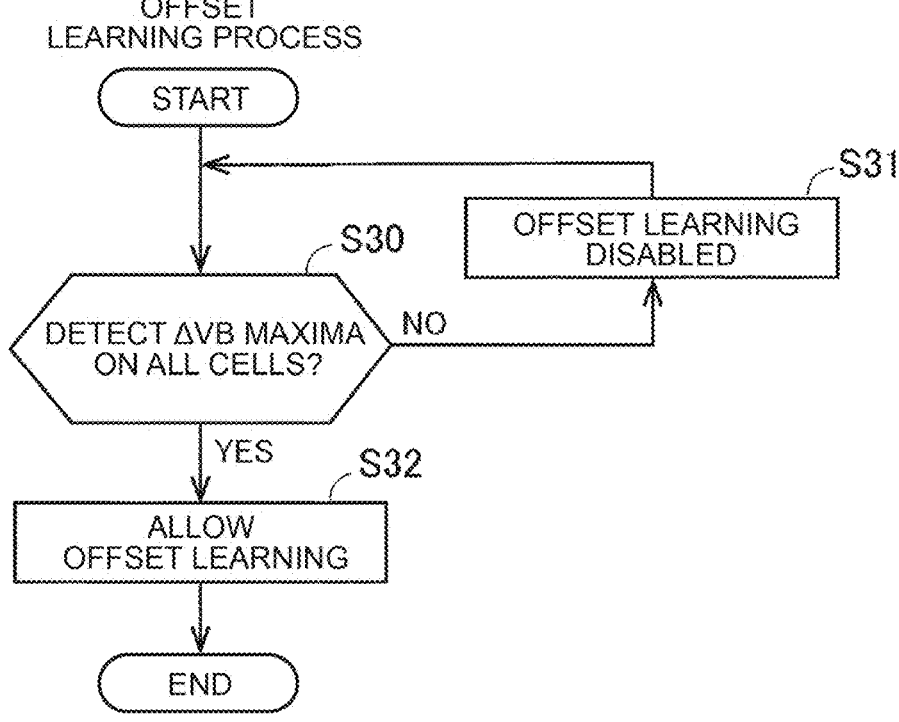
FIG. 5 is a flow chart showing an offset-learning process executed by ECU.

FIG. 5 is a flow chart illustrating an offset-learning process performed by ECU 300. This flowchart is executed when external charging of the battery 100 is started. In S30, it is determined whether or not the maximum value of the voltage-change amount $\Delta VB$ has been detected in all the unit cell 100$a$ constituting the battery 100. In all the unit cell 100$a$, when an affirmative determination is made by S13 (see FIG. 3), an affirmative determination is made by S30, and the process proceeds to S32. If no local maximum is detected in any of the unit cell 100a, a negative determination is made, and the process proceeds to S31.

In S31, after the offset-learning of the current sensor 220 is prohibited, the process returns to S30. In this case, the external charging of the battery 100 is not stopped for the offset learning. In S32, the present routine is terminated after the offset-learning is permitted.

When the offset learning is permitted, ECU 300 performs the offset learning by a learning routine (not shown). In the offset learning, the charging is suspended and the charging/discharging current does not flow through the battery 100. Then, the offset value (correction value) is obtained using the detection signal of the current sensor 220 when the charge/discharge current is 0, and 0-point correction of the current sensor 220 is performed. Suspension of charging may be performed at predetermined intervals (e.g., every 15 minutes).

Figure 6:
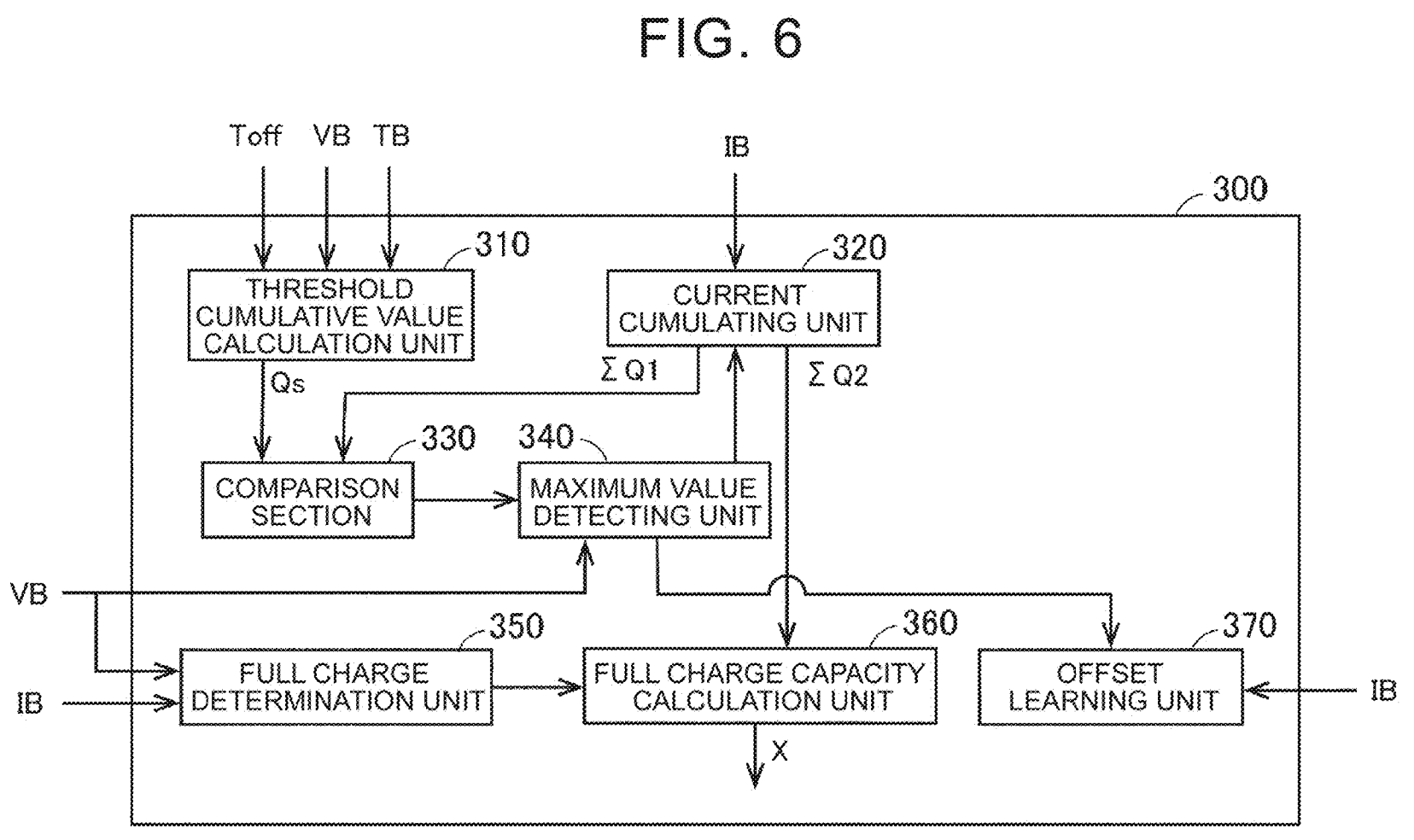

FIG. 6 is a diagram illustrating an exemplary functional block configured as a ECU 300 in the present embodiment. The threshold cumulative value calculation 310 calculates the threshold cumulative value Qs using IGOFF times Toff, the voltages VB, and the temperature TB. The current cumulating unit 320 calculates the first current cumulative value $\Sigma Q1$ and the second current cumulative value $\Sigma Q2$ by cumulating the current IB at the time of external charge. The comparing unit 330 compares the first current cumulative value Q1 with the threshold cumulative value Qs, and determines whether or not the first current cumulative value $\Sigma Q1$ exceeds the threshold cumulative value Qs. When the first current cumulative value $\Sigma Q1$ exceeds the threshold cumulative value Qs, the maximum value detecting unit 340 detects the maximum value of the voltage variation $\Delta VB$ based on the voltage VB. The full charge determination unit 350 determines that the battery 100 is fully charged based on the voltage VB or the current IB. The full charge capacity calculation unit 360 adds the second current cumulative value $\Sigma Q2$ to the reference capacity C2 to calculate the full charge capacity X. The offset learning unit 370 executes offset learning of the current sensor 220 when the maximum is detected in all the unit cell 100a.

According to the present embodiment, a first current cumulative value $\Sigma Q1$, which is a charging current cumulative value from the start of charging of the battery 100, is calculated. After the first current cumulative value $\Sigma Q1$ becomes equal to or larger than the threshold cumulative value Qs, the maximum value of the voltage variation $\Delta VB$ is detected. Then, the second current cumulative value $\Sigma Q2$, which is the cumulative value of the charging current from when the maximum value of the voltage change amount $\Delta VB$ is detected until the battery 100 is fully charged, is calculated. The full charge capacity X is calculated by adding the second current cumulative value $\Sigma Q2$ to the reference capacity C1. Detecting the maximum value of the voltage variation $\Delta VB$ is not performed until the first current cumulative value $\Sigma Q1$ becomes equal to or larger than the threshold cumulative value Qs. Therefore, OCV can satisfactorily detect the maximum value M2 corresponding to the step P2 on the high-voltage side without being affected by polarization or the like at the beginning of charging, and the full charge capacity X can be accurately estimated.

According to the present embodiment, the threshold-cumulative value Qs is set based on IGOFF period Toff, the voltage VB at the start of charging, and the temperature TB at the start of charging. A in which the state of polarization is grasped by the time (IGOFF time Toff) from the end of the previous charge/discharge to the start of the current charge of the battery 100, and the state of the remaining capacity (or SOC) of the battery 100 (unit cell 100a) can be grasped by the voltage VB at the start of the charge and the temperature TB at the start of the charge. By setting the threshold cumulative value Qs using these parameters, it is possible to satisfactorily ensure that OVC exhibits the maximum value M1 corresponding to the step P1 on the low-voltage side until the first current cumulative value $\Sigma Q1$ becomes equal to or larger than the threshold cumulative value Qs from the beginning of charging. As a result, OCV can satisfactorily detect the maximum value M2 corresponding to the high-pressure-side step P2.

According to the present embodiments, since the full charge capacity is estimated by using the second current cumulative value $\Sigma Q2$ from the time when the maximum value M2 corresponding to the step P2 of the second stage (OCV is on the high voltage side) until the full charge is reached, in which the cumulation error of the charge current is small and the estimation accuracy of the full charge capacity X can be improved.

According to the present embodiment, the offset-learning of the current sensor 220 is executed after the maximum value M2 is detected in all the unit cell 100a. Accordingly, since the charge is not stopped while the maximum value of the voltage variation $\Delta VB$ is being detected, erroneous detection of the maximum value caused by the variation of the voltage VB or the like can be suppressed.

In the above-described embodiment, an iron phosphate lithium-ion battery (LFP cell) is employed as the unit cell 100a. However, the unit cell 100a may be other types of cells as long as there is a small area (voltage flat area) in which the change in OCV curve is small and the maximum value of the voltage change amount $\Delta VB$ can be detected.

Vehicles to which the disclosed battery system S can be applied are not limited to electrified vehicle 1 shown in FIG. 1. The present disclosure is also applicable to, for example, a plug-in hybrid electric vehicle including an engine and a motor generator, and the present disclosure is also applicable to a fuel cell electric vehicle including a storage battery and capable of being externally charged. Alternatively, the vehicle may be an industrial vehicle such as a forklift. The battery system S may be a stationary battery.

The embodiment disclosed herein should be considered as illustrative and not restrictive in all respects. The scope of the present disclosure is defined not by the above description of the embodiments but by the claims, and is intended to include all possible modifications within a scope equivalent in meaning and scope to the claims.

What is claimed is:

1. A battery system, comprising a battery; a voltage sensor for configured to detect a voltage of the battery; a current sensor configured to detect a charging current of the battery; and a control device, wherein the control device includes a Central Processing Unit (CPU) configured to:

calculate a threshold value for a cumulative charging current value based on a time from an end time of charging or discharging of the battery at a previous time to a time of starting charging of the battery, a voltage at the time of starting charging, and a temperature of the battery at the time of starting charging;

compute the cumulative charging current value that is a cumulative value of the charging current of the battery, compare a first cumulative current value, which is the cumulative charging current value from the start of charging of the battery, with the threshold value, and determine whether the first cumulative current value exceeds the threshold value;

detect a maximum value of a voltage change amount when charging the battery, based on the voltage, wherein the CPU is configured to detect the maximum value of the voltage change amount only after the first cumulative current value becomes equal to or greater than the threshold value, the maximum value being detected on a side of the battery at which voltage is high; and estimate a full charge capacity of the battery, based on a second cumulative current value that is the cumulative charging current value from when the maximum value is detected until the battery is fully charged.

2. The battery system according to claim 1, wherein the CPU is configured to calculate the full charge capacity by adding the second cumulative current value to a reference capacity that is set in advance.

3. The battery system according to claim 1, wherein the CPU is further configured to stop charging of the battery and, calculate an offset value of the current sensor in response to detecting the maximum value.

4. An estimation method of estimating a full charge capacity of a battery, the estimation method comprising:

calculating a threshold value of a cumulative charging current value based on a time from an end time of charging or discharging of the battery at a previous time to a time of starting charging of the battery, a voltage at the time of starting charging, and a temperature of the battery at the time of starting charging;

computing the cumulative charging current value that is a cumulative value of a charging current of the battery;

comparing a first cumulative current value, which is the cumulative charging current value from a start of charging of the battery, with the threshold value, and determining whether the first cumulative current value is equal to or greater than the threshold value;

detecting a maximum value of a voltage change amount of the battery only after the first cumulative current value becomes equal to or greater than the threshold value; the maximum value being detected on a side of the battery at which voltage is high;

calculating a second cumulative current value that is the cumulative charging current value from when the maximum value is detected until the battery is fully charged; and estimating the full charge capacity of the battery based on the second cumulative current value.

* * * * *